(12) United States Patent
Gieskes

(10) Patent No.: US 6,625,878 B2
(45) Date of Patent: Sep. 30, 2003

(54) METHOD AND APPARATUS FOR IMPROVING COMPONENT PLACEMENT IN A COMPONENT PICK UP AND PLACE MACHINE

(75) Inventor: Koenraad A. Gieskes, Binghamton, NY (US)

(73) Assignee: Delaware Capital Formation, Wilmington, DE (US)

( * ) Notice: Subject to any disclaimer, the term of this patent is extended or adjusted under 35 U.S.C. 154(b) by 0 days.

(21) Appl. No.: 09/947,099

(22) Filed: Sep. 5, 2001

(65) Prior Publication Data

US 2003/0041450 A1 Mar. 6, 2003

(51) Int. Cl.[7] .................................................. H05K 3/30
(52) U.S. Cl. ............................. 29/740; 29/739; 29/741; 29/755
(58) Field of Search .......................... 29/740, 741, 840, 29/832, 705, 743, 759, 833, 834, 739, 755

(56) References Cited

U.S. PATENT DOCUMENTS

| | | | | |
|---|---|---|---|---|
| 4,631,816 A | * | 12/1986 | Fujita et al. | |
| 4,706,379 A | * | 11/1987 | Seno et al. | |
| 4,794,689 A | * | 1/1989 | Seno et al. | |
| 4,805,110 A | * | 2/1989 | Takahashi et al. | |
| 5,070,598 A | * | 12/1991 | Itagaki et al. | |
| 5,084,962 A | * | 2/1992 | Takahashi et al. | |
| 5,153,983 A | * | 10/1992 | Oyama | |

\* cited by examiner

*Primary Examiner*—Carl J. Arbes
(74) *Attorney, Agent, or Firm*—Salzman & Levy; David L. Banner

(57) ABSTRACT

A component pick and place apparatus includes a housing including; a rotatable frame and a plurality of pick-up and place heads mounted on the frame. The pick-up and place heads are rotatable from a first position to at least a second position, and includes a spindle which is movable from a retracted position to an extended position. A first actuator moves the spindle at the first position from the retracted position to the extended position for picking up or placing the component; and a second actuator moves a spindle so that when a pick-up and place head is at the second position a spindle is moved from the retracted position to the extended position for ascertaining the position of the picked-up component. This apparatus eliminates positional errors of the pick-up and place head spindle as it moves from its retracted position to its extended position when the component is placed.

5 Claims, 6 Drawing Sheets

METHOD AND APPARATUS FOR IMPROVING COMPONENT PLACEMENT IN A COMPONENT PICK UP AND PLACE MACHINE

BACKGROUND OF THE INVENTION

1. Field of the Invention

The present invention relates to a method and apparatus for ensuring proper positioning of an electronic component in a system for mounting the electronic component on a circuit board.

2. Description of Related Art

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

As used herein, the term "component position correcting" refers to correcting both the angular orientation of a component as well as the X-Y positioning of the component. Of course, in some cases only one of the angular orientation of the component or the X-Y positioning of the component will require adjustment.

Many types of equipment exist today for mounting electronic components on a circuit board, such as a printed circuit board. One such type of equipment includes a pick and place head that has one or more pick-up heads mounted thereon. Each pick-up head includes a spindle. At one end of the spindle is located a device for picking up the component. Such pick-up devices might include a vacuum nozzle or some other type of mechanical grabbing system. At the other end of the spindle is some type of actuating mechanism. The actuating mechanism moves the spindle from a retracted position to an extended position. In operation, the pick-up head is moved to a pick-up position above the component to be picked-up. When the pick-up head is in the pick-up position, the actuating mechanism is actuated so as to extend the spindle so that the pick-up device contacts and grabs the component. The actuating mechanism then moves the spindle to its retracted position so that the selected component may be withdrawn from the surface on which it rests. After the spindle is retracted, the pick-up head can be moved to another location so that the component can be placed at its intended location.

Due to the increased miniaturization of the components, and the miniaturization of the contact points on each component, it is important to ensure that the component is properly positioned before it is deposited at its intended location. Accordingly, at some point between the pick-up and the depositing of the component, the pick-up head must interact with a positioning system to ensure the proper positioning of the component.

In the past, such positioning may have been accomplished with a mechanical process in which the component was literally moved with respect to the pick-up head so that the component is properly positioned with respect to the pick-up head. More recently, the positioning is effected with a visual inspection system. Specifically, at some point after the component has been picked up by the pick-up head, the spindle is moved to a location adjacent a camera or imaging system. If it is determined that the component is angularly misaligned with respect to its intended placement, a system may be used to rotate the spindle to ensure proper angular orientation of the component.

On the other hand, if it is determined that the component is misaligned on the pick-up head with respect to X, Y positioning, the extent of misalignment is noted, and the pick-up head is moved accordingly when delivering the component to the intended location. Specifically, a control system notes the exact location of the component with respect to the pick-up head, and uses this information to properly place the component at the intended location.

After the component is grabbed by the pick-up head, the spindle is retracted so that the pick-up head can be moved without contacting other components. Some prior art systems, particularly those which include the vision system camera on the pick and place head, have performed the positioning analysis when the spindle is in a retracted position. However, when the component is deposited at the intended location, the spindle is extended. An inherent feature of the spindle assemblies is that when the spindle moves from the retracted position to the extended position, some shifting of the spindle and/or pick-up nozzle may occur. In other words, it is difficult to make a spindle assembly that is so precise in operation that there is no change in position of the pick-up nozzle as the spindle moves from the retracted position to the extended position, and vice versa.

Thus, in the above-mentioned prior art systems, even if the positioning of the component is exactly accomplished, as the spindle moves from the retracted position to the extended position, some shifting of the component may occur due to errors in the spindle movement. Because the positioning was effected when the spindle was in the retracted position, the changes in positioning of the component as the spindle moves from the retracted position to the extended position cannot be easily anticipated or compensated. Accordingly, such systems may result in inexact placement of the component, even though precise positioning was initially performed.

Some systems utilize a preprocessing analysis to calibrate the spindles. In such a system, the pick-up head is run through a complete cycle, wherein a vision system monitors each spindle as it moves from a retracted position to an extended position. The vision system monitors the extent of wobble or misalignment that occurs with regard to each spindle as it moves from the retracted position to an extended position, and records this information. Then, during routine processing, the recorded information concerning the wobble or misalignment of the spindle, is used to adjust each spindle during processing to minimize the extent of misalignment as the spindle moves from the retracted position to an extended position.

However, such a system may not provide enough precision or accuracy for modern needs. Accordingly, a more precise system is necessary if higher levels of precision are desired.

OBJECTS AND SUMMARY

It is an object of the present invention to provide a system that is fast and efficient for positioning each component as it is deposited at its intended location.

It is also an object of the present invention to provide a system that is able to properly position a component with respect to its intended location, while taking into account any eccentricity or irregularities caused by movement of the spindle as the spindle moves from its retracted position to its extended position.

According to the present invention, one embodiment of a component pick and place head includes a frame; a pick-up head mounted on the frame; the pick-up head being movable from a first position in which a component is picked-up by the pick-up head to a second position in which a position of the component that has been picked up by the pick-up head is ascertained; the pick-up head being actuatable from a retracted configuration to an extended configuration for picking up the component; a first actuator for actuating the pick-up head at the first position from the retracted configuration to the extended configuration; and a second actuator at the second position for actuating the pick-up head at the second position from the retracted configuration to the extended configuration.

According to the present invention, another embodiment of a component pick and place head includes a plurality of nozzles actuatable between a retracted configuration and an extended configuration; and a cam surface adjacent a travel path of the plurality of nozzles and adjacent a camera of a vision system; the cam surface arranged so as to actuate each of the plurality of nozzles to the extended configuration as the each of the plurality of nozzles is adjacent the camera of the vision system.

According to the present invention, a method of picking and placing a component includes the steps of extending a spindle on a pick-up head from a retracted position to an extended position; picking up a component with the spindle while the spindle is in the extended position; retracting the spindle to the retracted position; moving the pick-up head with the component on it to a component position ascertation position; extending the spindle to the extended position; ascertaining a position of the component at the component position ascertation position while the pick-up head and the component are at the component position ascertation position; and depositing the component at a component deposition position.

DETAILED DESCRIPTION OF THE PREFERRED EMBODIMENTS

In the electronics industry, robotic systems are used to pick up a component from one location and deliver the component with a high degree of accuracy to an intended location so that the component can be soldered or otherwise attached to a circuit board, such as a printed circuit board. Such systems are sometimes referred to as pick and place machines.

Figure 1A:
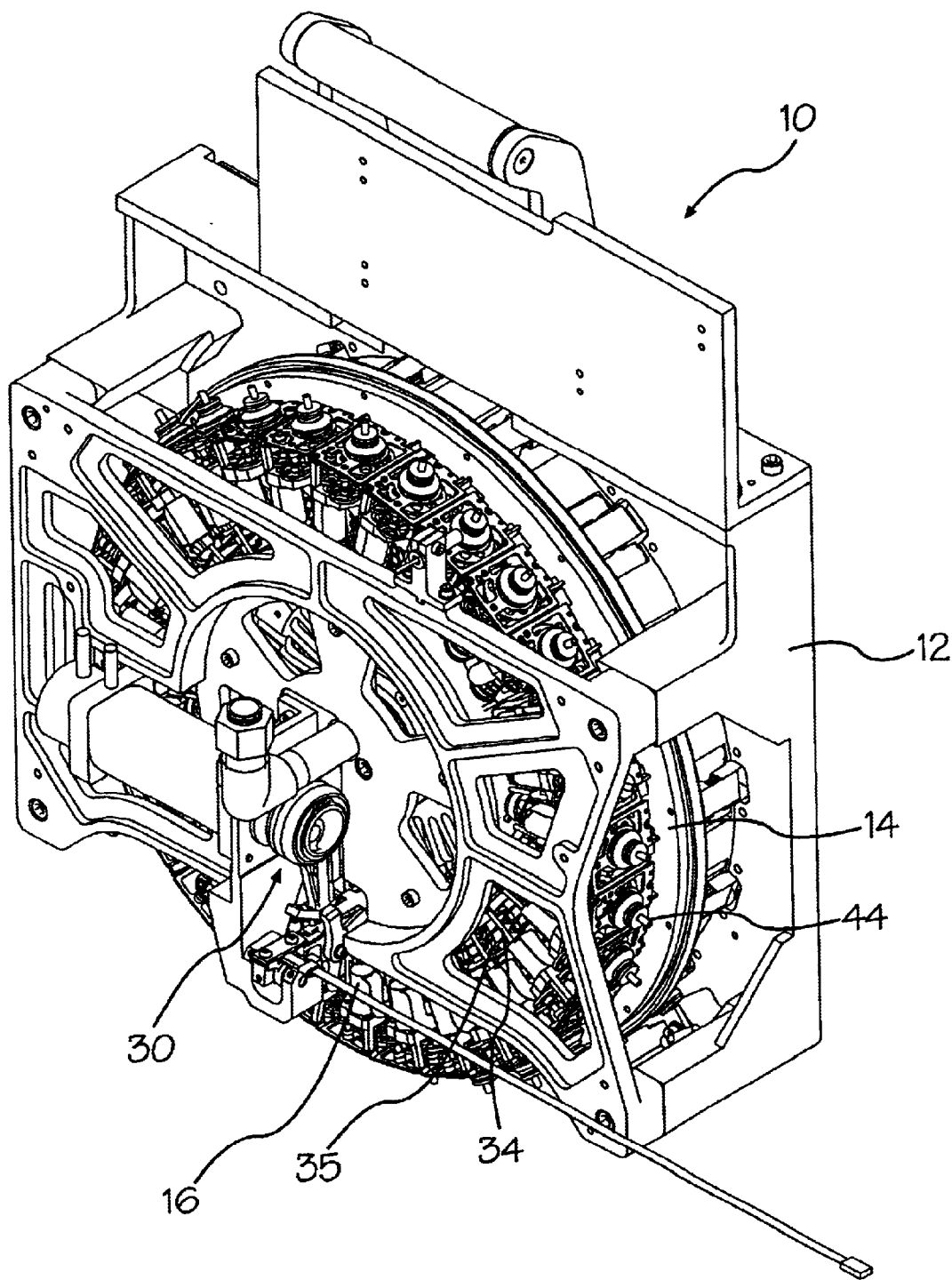
FIG. 1 is a front elevational schematic view of a pick and place head according to the present invention.
Figure 1B:
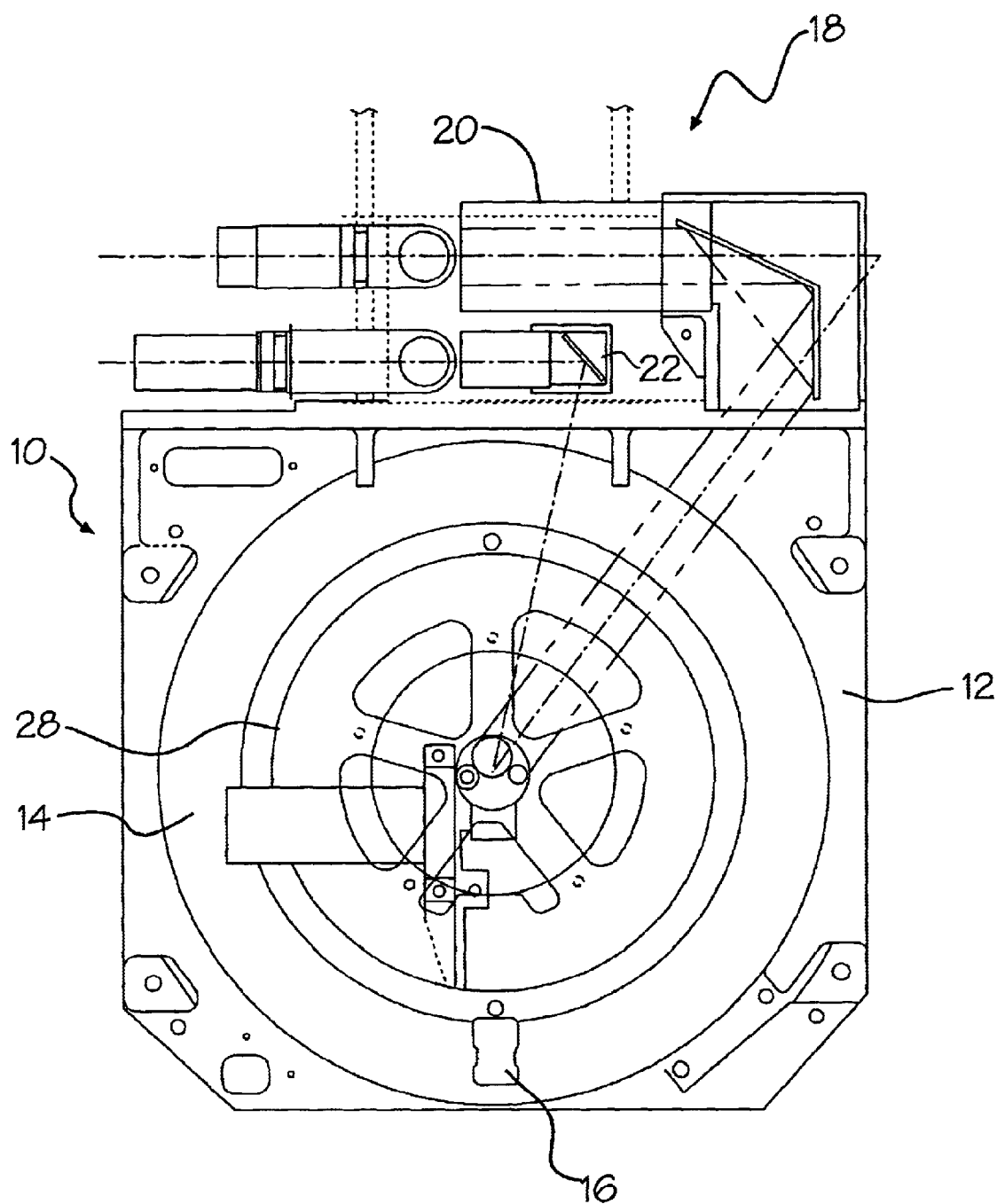

In a pick and place machine, a pick and place head may include a plurality of pick-up heads, each of which are used to pick up one or more of the components for delivery to the intended location. FIG. 1 is a schematic view of a pick and place head 10 according to the present invention, on which is mounted a plurality of pick-up heads 16, only one of which is actually shown in the drawing.

The pick and place head 10 illustrated in the FIG. 1 includes a circular frame 14 that is fixed to an electric motor for rotating the frame 14 about its axis. The plurality of pick-up heads 16 (only one of which is shown) is secured to the outer circumference of the circular frame 14.

The pick and place head 10 is mounted on a conventional translating mechanism which enables the pick and place head 10 to be moved in the X, Y axes. The pick and place head 10 also includes some type of vision system (not shown) to detect fiducial markings at or near the intended location so that the pick-up head 16 can be placed with high precision with respect to the intended location. The pick and place head 10 includes an actuating mechanism 30 located at a lower portion thereof. The pick-up head also includes a camera 18, which is part of a vision system, at another location thereof for positioning a component that has been picked up by the pick-up nozzle on a spindle.

Figure 2:
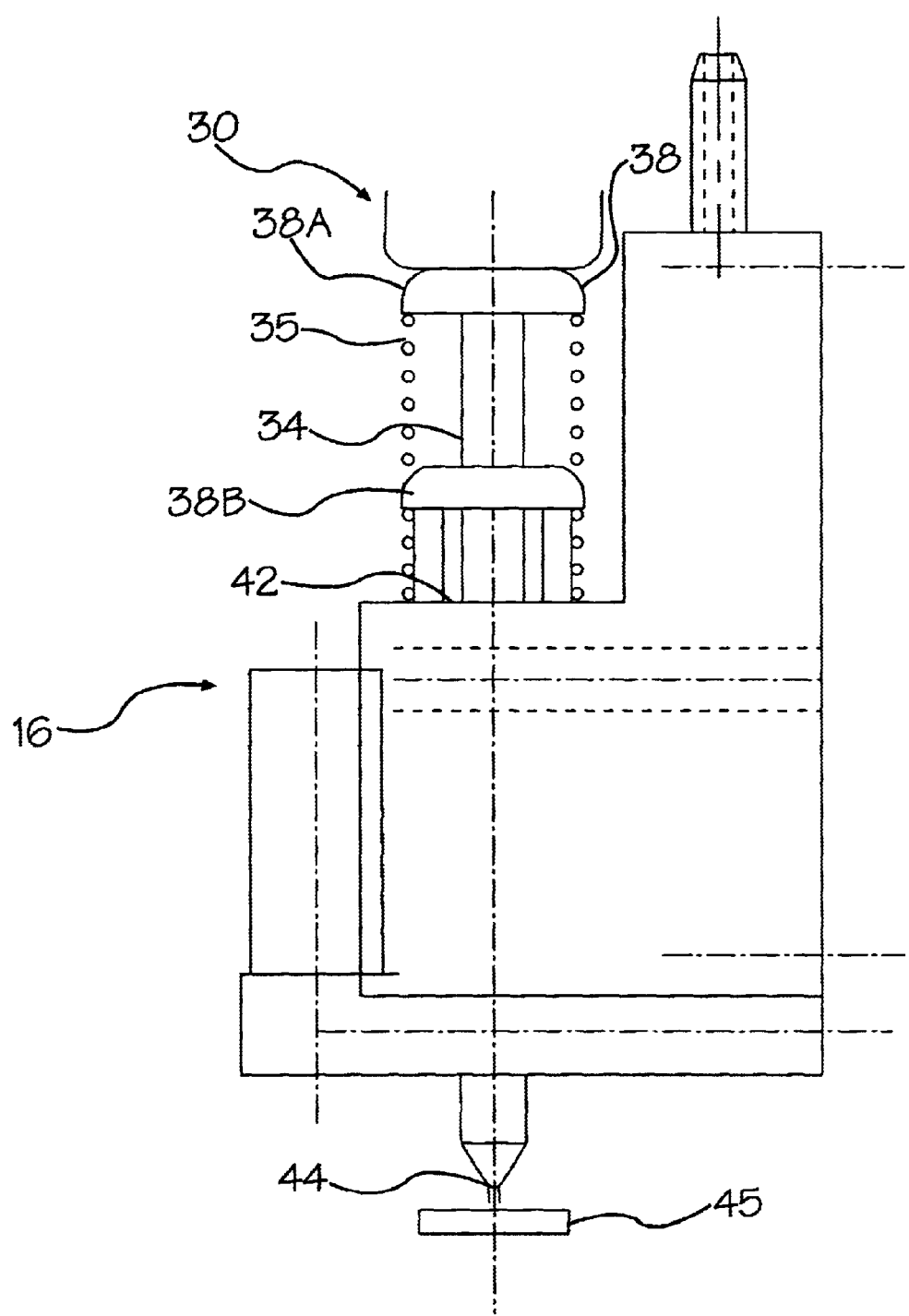
FIG. 2 is a side elevational view of a pick-up head according to the present invention.
Figure 3A:
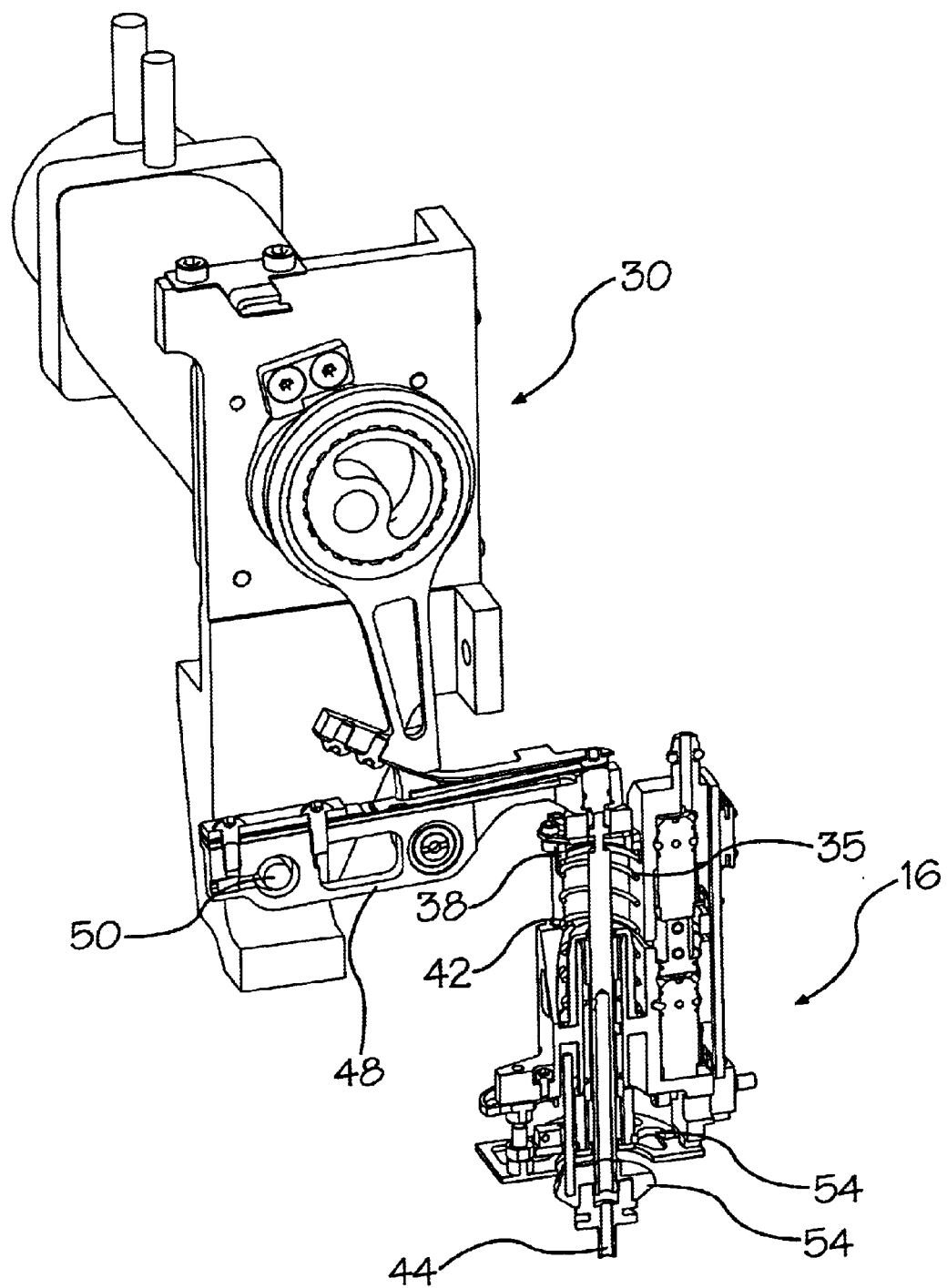
FIG. 3 is sectional view of the pick-up head and a portion of an activating mechanism according to the present invention.
Figure 3B:
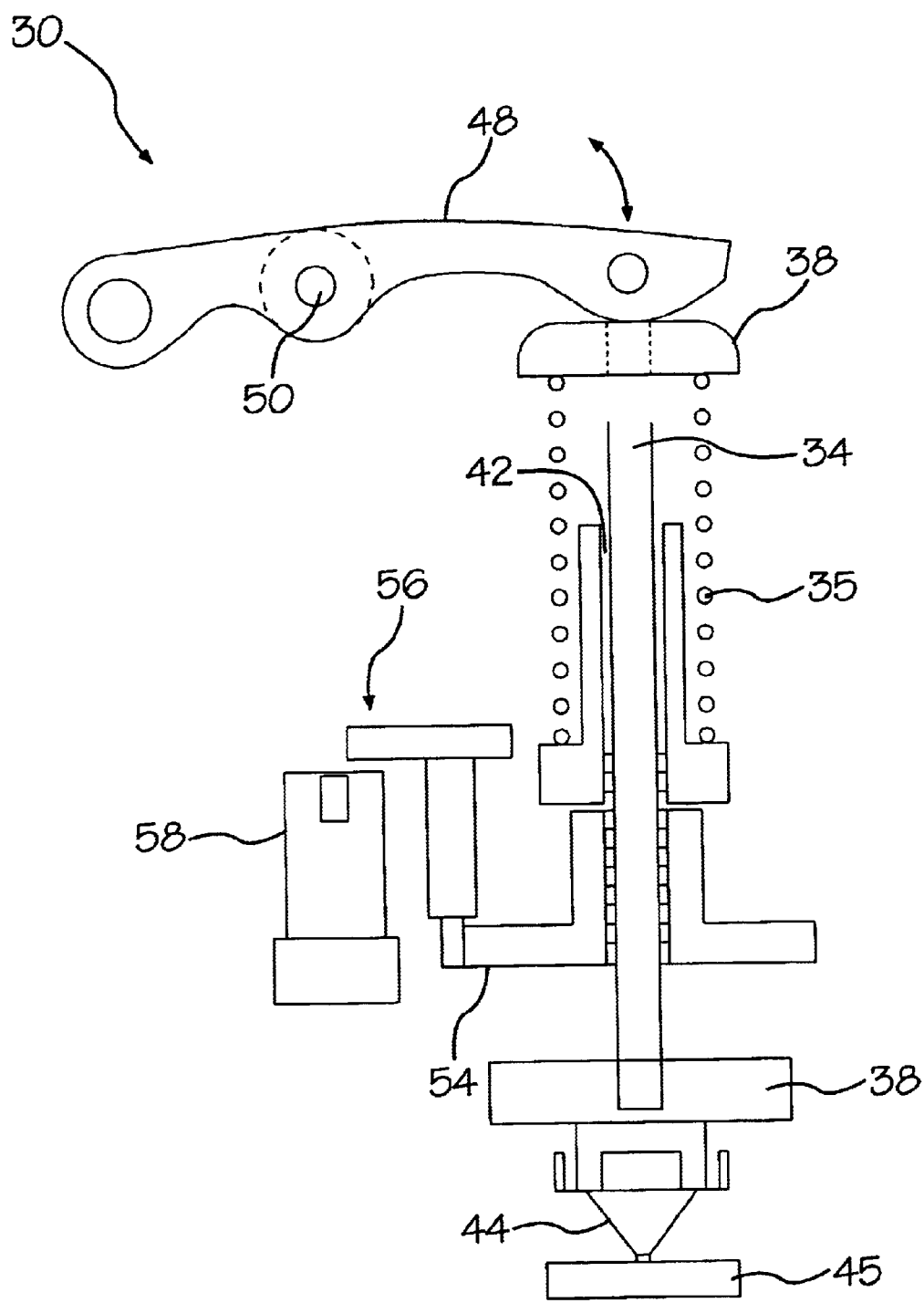

FIGS. 2 and 3 illustrate a pick-up head 16 for use with the present invention. The pick-up head 16 includes a spindle 34, and the spindle 34 includes a pick-up device, such as a vacuum nozzle 44, for grabbing component 45 to be placed.

The spindle 34 is slidable within a receiving bore 42. A flanged or enlarged head 38 at one end of the spindle 34 is intended to be contacted by the activating system 30. A spring 35 is arranged concentrically with respect to the spindle 34 so as to exert a biasing force between the underside of the head 38 and a fixed portion of the pick-up head 16.

A gear mechanism 54 is provided to adjust the angular orientation of the spindle 34 and the component 44 held thereby. The gear mechanism 54 is driven by a motor 58 through a drive train 56.

The activating assembly 30 includes an arm 48 that is pivotably mounted about a shaft 50. At one end of the arm 48, a contacting surface is provided which makes contact with the head 38 of the spindle 34. At the opposite end of the arm 48, a driving lever (not shown) is attached in order to pivot the arm 48 back and forth about the shaft 50. The activating mechanism is fixed to a lower portion of the frame 14 of the pick and place head 10. However, other types of activating mechanisms can be used with the present invention, instead of the disclosed activating mechanism.

In operation, a translating mechanism (not shown) moves the pick and place head 10 to a location above a component to be picked up. The actuating mechanism 30 then actuates the spindle 34 in the pick-up head 16 to the actuating position, wherein the spindle 34 is extended down until the pick-up nozzle 44 contacts and picks up the component 45. The actuating mechanism 30 then enables the spindle 34 to be retracted.

In one embodiment, the spring 35 biases the spindle 34 to a retracted position. Accordingly, the actuating mechanism 30 merely depresses the head 38 at one end of the spindle 34, opposite the pick-up nozzle 44, in order to extend the spindle 34. Reference numeral 38A shows the head of the spindle in its retracted position, and 38B shows the head of the spindle in its extended position. In order to retract the spindle 34, the actuating mechanism merely withdraws away from the spindle 34, enabling the spring 35 to move the spindle 34 to its retracted position. However, it should be noted that the present invention is not limited to any particular type of actuating mechanism or pick-up head. Thus, the present invention may have applicability to other systems using different types of pick-up heads and/or activating mechanisms.

After the component 45 has been picked up, and the spindle 34 is retracted, the pick and place head 10 is then moved to another location to pick up another component with another pick-up head 16. At this time, the circular frame 14 is rotated incrementally so that a different pick-up head is in the lowermost or activating position. The activating mechanism 30 then activates the spindle in the next pick-up head to extend the spindle so that it may pick up the next component, as described above with respect to the first pick-up head and the first component. The process is repeated until as many as components as needed or as can fit on the pick and place head 10 are picked up.

Prior to depositing the components at their intended locations, the components are positioned with respect to their intended location. In a preferred embodiment of the present invention, the positioning is accomplished with a vision system 18. In the embodiment, the vision system 18 includes two different cameras 20, 22. Such vision systems capable of positioning the components are well known in the industry, and the details thereof are omitted from this specification.

As the circular frame 14 of the pick and place head 10 rotates, each pick-up head incrementally moves in a circular path around the pick and place head 10. In order to ensure a highly accurate positioning, the pick and place head 10 interacts with each pick-up head 16, as the pick-up head 16 passes in front of the vision system 20, so as to extend the spindle 34. In one embodiment of the present invention, the spindle 34 is extended by passing the spindle 34 over a cam 28 or a bulge in a stationary part of the pick and place head 10. Specifically, as the spindle 34 passes over the cam portion, the cam engages the spindle 34, and urges the spindle 34 against the biasing force of the spring 35 so that the spindle 34 is extended.

Figure 4:
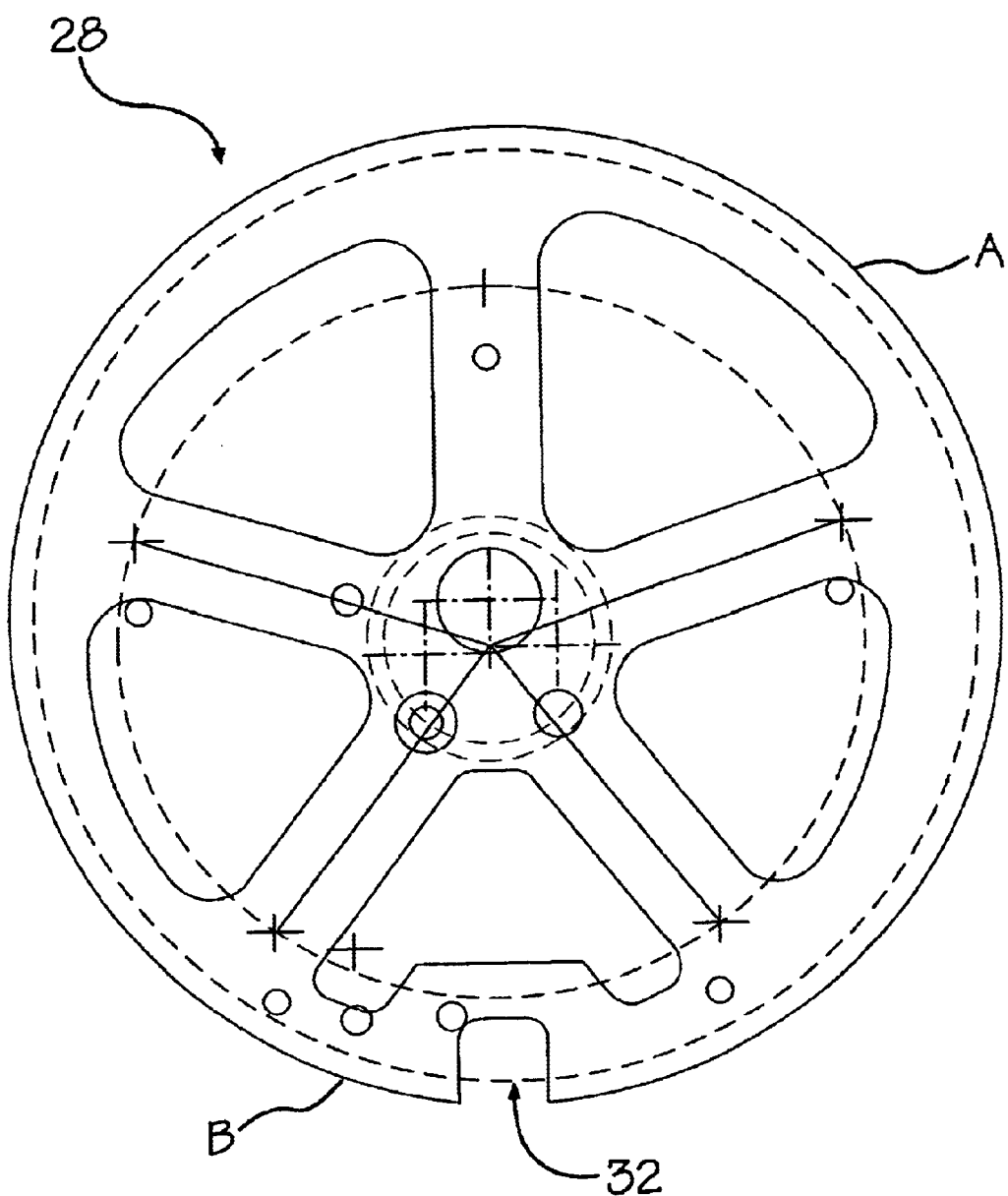
FIG. 4 is a front elevational view of a cam according to the present invention.

FIG. 4 is a front elevational view of the cam 28. The cam 28 includes a bulge or large portion at point A. At point B, the cam 28 is narrower. The cam 28 also includes a cut-out portion 32 at a lower portion thereof. The activating mechanism 30 fits within the cut-out portion 32.

Ideally, the cam 28 will extend the spindle 34 the same distance as the spindle is extended when the component 44 is delivered to the intended location. However, for purposes of simplicity, an average extension distance is determined, and the cam is constructed so as to extend each spindle 34 the average distance used. Thus, although each spindle 34 may not be extended to the exact position in which it will be extended when the component 44 is deposited, the differences between the exact position and the position extended by virtue of the cam are not large enough to cause any significant errors. In a preferred embodiment, it is assumed that the average extension distance is 11 millimeters. Accordingly, the bulge or cam shape portion of the pick and place head 10 is intended to extend the spindle 11 millimeters.

In an alternative embodiment of the present invention, instead of using a cam 28 to extend the spindles 34 in front of the vision system 20, a second activating system, similar to the aforedescribed activating system 30 at the lower portion of the pick and place head 10, may be used to extend the spindle 34 in front of the vision system 20.

Although the present invention has been described in connection with exemplary embodiments thereof, it will be appreciated by those skilled in the art that additions, deletions, modifications, and substitutions not specifically described may be made without departing from the spirit and scope of the invention as defined in the appended claims.

What is claimed is:

1. An apparatus for picking up and placing a component, comprising:

a housing;

a frame rotatably mounted to the housing;

a plurality of pick-up and place heads mounted on the frame, the pick-up and place heads being rotatable between a first position to at least a second position;

each of the pick-up and place head further comprising a spindle being movable from a retracted position to a desired extended position;

a first actuator attached to the housing for moving the spindle, when a pick-up and place head is rotated to the first position from the retracted position to the extended position for picking up and placing a component;

a second actuator attached to the housing for moving the spindle, with picked up component when the pick-up and place head is rotated to the second position, from the retracted position to the extended position; and a vision system comprising an image capturing device attached to the housing proximate the second position adapted for ascertaining the position of the picked-up component when the spindle is at the extended position;

whereby the positional error of the picked-up component caused by the spindle moving from the retracted position to the extended position when the component is placed is eliminated.

2. The apparatus for picking up and placing a component of claim 1, wherein the frame is substantially circular and rotates about a central axis.

3. The apparatus for picking up and placing a component of claim 1, wherein the first actuator includes a pivoting lever mounted on the housing proximate the first position.

4. The apparatus for picking up and placing a component of claim 1, wherein the second actuator includes a cam surface on the housing.

5. The apparatus for picking up and placing a component of claim 1, wherein said vision system comprises a CCD camera.

* * * * *